US008518725B2

(12) United States Patent
Terasaki et al.

(10) Patent No.: US 8,518,725 B2

(45) Date of Patent: Aug. 27, 2013

(54) STRUCTURE MANUFACTURING METHOD AND LIQUID DISCHARGE HEAD SUBSTRATE MANUFACTURING METHOD

(75) Inventors: Atsunori Terasaki, Kawasaki (JP); Masahiko Kubota, Tokyo (JP); Ryoji Kanri, Zushi (JP); Yoshiyuki Fukumoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/521,694

(22) PCT Filed: Jan. 13, 2011

(86) PCT No.: PCT/JP2011/000119

§ 371 (c)(1), (2), (4) Date: Jul. 11, 2012

(87) PCT Pub. No.: WO2011/086914

PCT Pub. Date: Jul. 21, 2011

(65) Prior Publication Data

US 2012/0282715 A1 Nov. 8, 2012

(30) Foreign Application Priority Data

Jan. 14, 2010 (JP) ................................. 2010-005824
Jan. 7, 2011 (JP) ................................. 2011-002039

(51) Int. Cl.

| | |
|---|---|
| ***H01L 21/00*** | (2006.01) |
| ***H01L 21/30*** | (2006.01) |
| ***H01L 21/46*** | (2006.01) |
| ***B21D 53/76*** | (2006.01) |
| ***B23P 17/00*** | (2006.01) |
| ***G01D 15/00*** | (2006.01) |
| ***G11B 5/127*** | (2006.01) |
| ***B44C 1/22*** | (2006.01) |
| ***C03C 15/00*** | (2006.01) |
| ***C03C 25/68*** | (2006.01) |
| ***C23F 1/00*** | (2006.01) |

(52) U.S. Cl.
USPC ...... 438/21; 438/455; 438/456; 257/E21.001; 257/E21.218; 29/890.1; 216/27; 216/67

(58) Field of Classification Search
USPC .................. 438/21, 455, 456; 257/E21.001, 257/E21.218; 29/890.1, 611; 216/27, 67, 216/57, 49; 347/44, 55–57, 63, 65
See application file for complete search history.

(56) References Cited

U.S. PATENT DOCUMENTS 6,126,276 A * 10/2000 Davis et al. ..................... 347/65
6,569,343 B1 * 5/2003 Suzuki et al. .................. 216/27

(Continued)

*Primary Examiner* — Mary Wilczewski
*Assistant Examiner* — Erik T. K. Peterson
(74) *Attorney, Agent, or Firm* — Canon U.S.A., Inc., IP Division

(57) ABSTRACT

A method for processing a silicon substrate includes providing a combination of a first silicon substrate, a second silicon substrate, and an intermediate layer including a plurality of recessed portions, which is provided between the first silicon substrate and the second silicon substrate, forming a first through hole that goes through the first silicon substrate by executing etching of the first silicon substrate on a surface of the first silicon substrate opposite to a bonding surface with the intermediate layer by using a first mask, and exposing a portion of the intermediate layer corresponding to the plurality of recessed portions of the intermediate layer, forming a plurality of openings on the intermediate layer by removing a portion constituting a bottom of the plurality of recessed portions, and forming a second through hole that goes through the second silicon substrate by executing second etching of the second silicon substrate by using the intermediate layer on which the plurality of openings are formed as a mask.

7 Claims, 12 Drawing Sheets

(56) References Cited

U.S. PATENT DOCUMENTS

| | | | | |
|---|---|---|---|---|
| 6,679,587 | B2 | 1/2004 | Chen | |
| 6,902,867 | B2 * | 6/2005 | Hall et al. | 430/311 |
| 7,318,277 | B2 * | 1/2008 | Torimoto et al. | 29/890.1 |
| 7,560,224 | B2 * | 7/2009 | Sato et al. | 430/320 |

* cited by examiner

STRUCTURE MANUFACTURING METHOD AND LIQUID DISCHARGE HEAD SUBSTRATE MANUFACTURING METHOD

TECHNICAL FIELD

The present invention relates to a method for manufacturing a structure and a method for manufacturing a liquid discharge head substrate, which is used for a liquid discharge head configured to discharge liquid.

BACKGROUND ART

A fine structure, which is produced by processing silicon, has been widely used in the field of micro electro mechanical systems (MEMS) and in a functional device of an electric machine. More specifically, a fine structure is used in a liquid discharge head configured to discharge liquid, for example. A liquid discharge head that discharges liquid is used in an inkjet recording head used in an inkjet recording method for discharging an ink on a recording medium to record an image.

An ink jet recording head includes a substrate, on which an energy generation device configured to generate energy utilized for discharging liquid is provided, and a discharge port configured to discharge an ink supplied from a liquid supply port provided on the substrate.

U.S. Pat. No. 6,679,587 discusses the following method for manufacturing an inkjet recording head like this. In this conventional method, at first, a mask having a plurality of openings is laminated between a first silicon substrate and a second silicon substrate. Then, the first silicon substrate is etched to the second silicon substrate, and a first through hole provided through the first silicon substrate is formed. Thus, the plurality of openings of the mask is exposed.

Furthermore, the etching is continued to execute etching on the second silicon substrate by utilizing the exposed mask. Then second through holes corresponding to the plurality of openings are formed. In the above-described manner, supply ports provided through the first and the second silicon substrates are formed.

However, in etching the first silicon substrate, the etching speed in the direction of the thickness of the substrate tends to differ in different regions of the surface of a silicon substrate. Accordingly, the second through hole formed on a region on which etching has been executed at a high speed may be formed in a shape wider than a pre-determined shape toward the surface of the silicon substrate, compared with the shape of other second through holes. As a result, a desired liquid supply characteristic may not be achieved due to unevenness of the sizes of the second through holes.

CITATION LIST

Patent Literature

PTL 1: U.S. Pat. No. 6,679,587

SUMMARY OF INVENTION

The present invention is directed to a structure manufacturing method, particularly to a method for manufacturing a structure capable of manufacturing a structure on which second through holes, which communicate with first through holes, are formed with a high accuracy of form and high yield. In addition, the present invention is directed to a method capable of manufacturing a liquid discharge head having second through holes that communicate with first through holes, which are formed with a high accuracy of form and high yield and having a highly stable liquid supply characteristic.

According to an aspect of the present invention, a method for processing a silicon substrate for forming openings having a step portion on the silicon substrate includes bonding a first silicon substrate and a second silicon substrate together via an intermediate layer having a first pattern form, forming a first opening by executing first dry etching down to a depth at which the intermediate layer is exposed on a surface of the second silicon substrate opposite to a bonding surface of the second silicon substrate with the intermediate layer by using a mask having a second pattern form, forming a second opening by executing second dry etching by using the intermediate layer as a mask.

ADVANTAGEOUS EFFECTS OF INVENTION

According to an aspect of the present invention, first etching is stopped by an intermediate layer. Therefore, according to an aspect of the present invention, the accuracy of processing for forming second through holes may hardly be affected by unevenness in the first etching. Accordingly, an aspect of the present invention can implement the manufacture of a structure, on which second through holes are formed with a high accuracy of form, at high yield.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the present invention.

DESCRIPTION OF EMBODIMENTS

The accompanying drawings, which are incorporated in and constitute a part of the specification, illustrate exemplary embodiments, features, and aspects of the invention and, together with the description, serve to explain the principles of the present invention.

A structure manufacturing method according to each exemplary embodiment of the present invention can be applied to a method for manufacturing a micro-machine, such as an acceleration sensor as well as to a liquid discharge head substrate manufacturing method.

A first exemplary embodiment of the present invention will now be described below.

FIGS. 1A through 1H illustrate a method for manufacturing a substrate for a liquid discharge head according to the present exemplary embodiment.

Figure 1A:
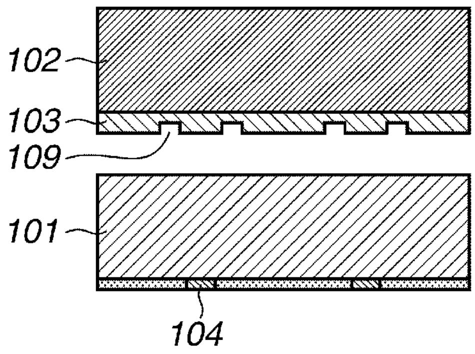
FIG. 1A is a cross section schematically illustrating a method for manufacturing a liquid discharge head according to an exemplary embodiment of the present invention.

Referring to FIG. 1A, in the present exemplary embodiment, a second silicon substrate 101 and a first silicon substrate 102 are provided. The second silicon substrate 101 includes an energy generation device 104, which includes an energy generation device for generating energy to be utilized for discharging liquid. An intermediate layer 103 is formed on at least one of the first silicon substrate 102 and the second silicon substrate 101. The intermediate layer 103 includes a plurality of recessed portions 109, which is used as a mask when a supply port is formed.

More specifically, the intermediate layer 103 is formed on the first silicon substrate 102 and a first pattern form, which is used for forming the supply port on the intermediate layer 103, is formed. In forming the intermediate layer 103, the intermediate layer 103 is provided with an opening not deep enough for the first silicon substrate 102 to be exposed, and is partially left unetched by an arbitrary thickness.

The intermediate layer 103 functions as a stopper used during subsequent first dry etching and as a first mask used during subsequent second dry etching. In other words, in the present exemplary embodiment, in forming a common liquid chamber by the first dry etching, the intermediate layer 103 functions as a stopper. On the other hand, in forming a supply port by the second dry etching, the intermediate layer 103 functions as a mask.

In the present exemplary embodiment, the intermediate layer 103 having a first pattern form is provided between the first silicon substrate 102 and the second silicon substrate 101. Accordingly, the present exemplary embodiment can form an opening having a step with a high accuracy. In addition, the present exemplary embodiment having the above-described configuration can prevent occurrence of a crown-like residue or a bent opening that may otherwise occur during a Bosch process.

For a material of the intermediate layer 103, a resin material, silicon oxides, silicon nitrides, silicon carbides, a metal material other than that made of silicon, or metallic oxides or nitrides thereof can be used. To paraphrase this, the intermediate layer 103 can include a resin layer, a silicon oxide film, a silicon nitride film, a silicon carbide film, a metallic film, or a metallic oxide film or a nitride film thereof.

If a resin layer is used as the intermediate layer 103, light-sensitive resin layers can be used. Among various light-sensitive resin layers, a photosensitive resin layer or a silicon oxide film is particularly useful because the intermediate layer 103 can be easily formed if these are used.

The second silicon substrate 101 has a thickness of 50 to 800 micrometers, for example. From a viewpoint of the shape of the supply port (i.e., the second through hole), the second silicon substrate 101 can have a thickness of 100 to 200 micrometers.

The first silicon substrate 102 has a thickness of 100 to 800 micrometers, for example. In a view point of the shape of a common liquid chamber (i.e., the first through hole), the first silicon substrate 102 desirably have a thickness of 300 to 600 micrometers.

Figure 1B:
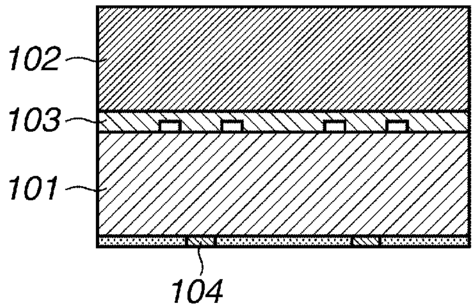
FIG. 1B is a cross section schematically illustrating a method for manufacturing a liquid discharge head according to an exemplary embodiment of the present invention.

Subsequently, as illustrated in FIG. 1B, the first silicon substrate 102 and the second silicon substrate 101 are bonded with each other via the intermediate layer 103.

For the method for bonding the substrates, a method for bonding substrates by using a resin material can be used. In addition, various other methods in which activated substrate surfaces are caused to come into contact with each other to be spontaneously bonded together, such as fusion bonding, eutectic bonding, or diffusion bonding, can be used.

Figure 1C:
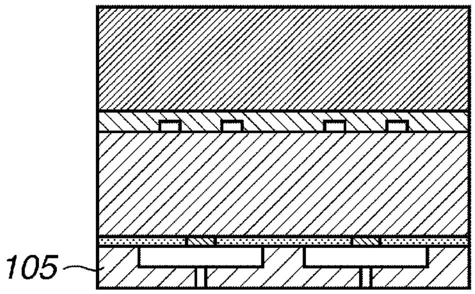
FIG. 1C is cross section schematically illustrating a method for manufacturing a liquid discharge head according to an exemplary embodiment of the present invention.

Furthermore, as illustrated in FIG. 1C, a path-forming layer 105 is formed on the surface of the second silicon substrate 101. More specifically, the path-forming layer 105 constitutes a liquid path between the liquid discharge port and a liquid path.

Figure 1D:
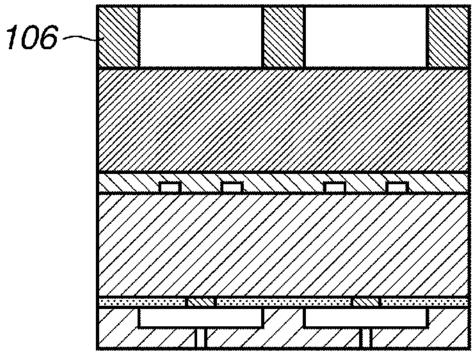
FIG. 1D is a cross section schematically illustrating a method for manufacturing a liquid discharge head according to an exemplary embodiment of the present invention.

Then, as illustrated in FIG. 1D, a second mask 106 is formed on the surface of the first silicon substrate 102. The second mask 106 includes a form of a second pattern, which is to be used as a mask in forming the common liquid chamber.

A material of the second mask 106 is not limited to a specific material. In other words, a material usually used as a mask can be used. More specifically, an organic material, a silicon compound, or a metallic film can be used. If an organic material is used, a photoresist can be used, for example.

If a silicon compound is used, a silicon oxide film can be used. Furthermore, if a metallic film is used, a chrome film or an aluminum film can be used. Alternatively, a material including multiple layers of the above-described materials can be used.

Figure 1E:
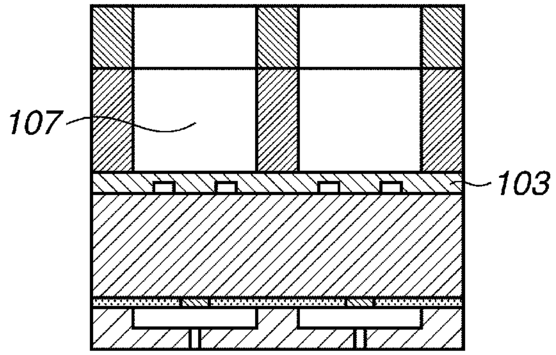
FIG. 1E is a cross section schematically illustrating a method for manufacturing a liquid discharge head according to an exemplary embodiment of the present invention.

Furthermore, as illustrated in FIG. 1E, first dry etching processing is executed by using the second mask 106 down to the depth at which the intermediate layer 103 is exposed. Thus, a common liquid chamber (a first opening) 107 is formed.

In the present exemplary embodiment, the intermediate layer 103 is made of a material whose etching rate is lower than the etching rate of silicon but not as low as an etching rate at which a function of the intermediate layer 103 as a mask will not fail. Accordingly, the etching in the common liquid chamber 107 is stopped by the intermediate layer 103, except the opening having the first pattern form. In other words, the intermediate layer 103 functions as the stop for the first dry etching.

At this timing, because a through pattern is not formed on the intermediate layer 103, the second silicon substrate 101 is not exposed at all when viewed from the common liquid chamber 107 side. Accordingly, the etching on the second silicon substrate 101 may not adversely progress due to the first dry etching.

Figure 1F:
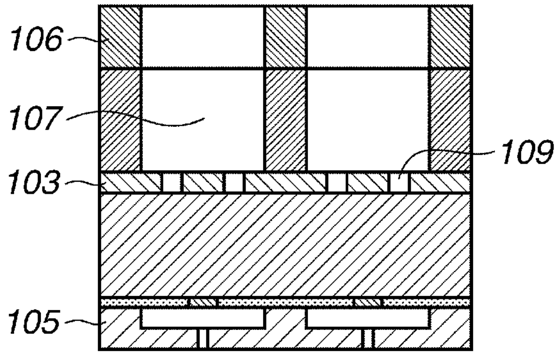
FIG. 1F is a cross section schematically illustrating a method for manufacturing a liquid discharge head according to an exemplary embodiment of the present invention.

Subsequently, as illustrated in FIG. 1F, an opening 109 is formed by removing a portion forming a bottom of a recessed portion of the intermediate layer 103.

Figure 1G:
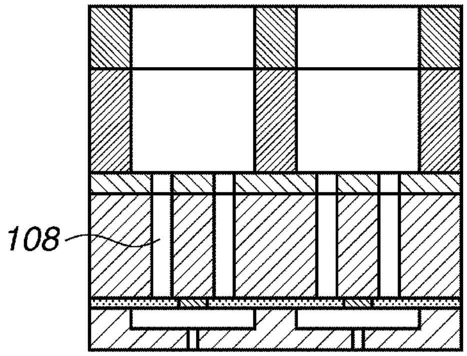
FIG. 1G is a cross section schematically illustrating a method for manufacturing a liquid discharge head according to an exemplary embodiment of the present invention.

Furthermore, as illustrated in FIG. 1G, a supply port 108 is formed by second dry etching by using the intermediate layer 103 as the first mask. The supply port 108 can communicate with the common liquid chamber 107.

For the second dry etching, the same method as the first dry etching can be used. For executing the dry etching, the etching conditions can be changed. More specifically, the second dry etching can be executed under a predetermined condition useful for achieving an appropriate aspect ratio.

In addition, as described above, during dry etching on silicon, the etching rate of the intermediate layer 103 is low enough to function as a mask used for forming the supply port 108.

Figure 1H:
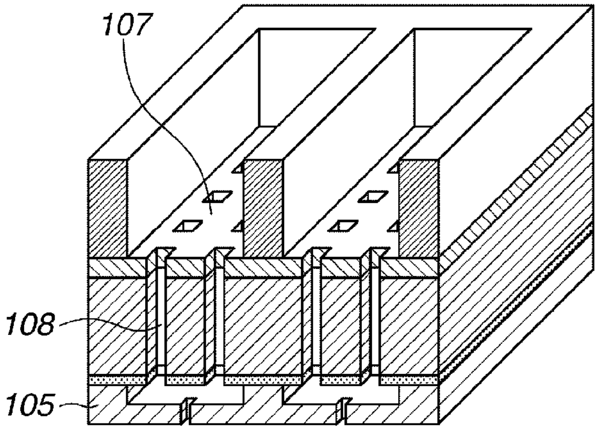
FIG. 1H is a cross section schematically illustrating a method for manufacturing a liquid discharge head according to an exemplary embodiment of the present invention.

Furthermore, as illustrated in FIG. 1H, the second mask 106 is removed. In the above-described manner, a liquid discharge head including the path-forming layer 105 provided on the liquid discharge head substrate can be produced.

By executing the above-described method, the present exemplary embodiment can process a silicon substrate for a liquid discharge head. According to the present invention, it is enough to execute dry etching once on one surface of the substrate. Accordingly, the present exemplary embodiment having the above-described configuration can form the common liquid chamber 107 and the supply port 108 in a state in which the path-forming layer 105 has been formed. In addition, dry etching for forming the common liquid chamber and that for forming the supply port can be completely separated from each other. Accordingly, a very highly accurate form control on the entire surface can be implemented. Each exemplary embodiment of the present invention can be applied as a method for manufacturing a liquid discharge head.

An exemplary method for bonding substrates together and the intermediate layer 103 will be described in detail below. If the intermediate layer 103 is made of a resin material, silicon substrates can be bonded together by the following method. At first, a resin is applied onto silicon substrate. Then, an intermediate layer is formed by patterning. After that, the silicon substrates are stacked together with the intermediate layer sandwiched therebetween. Furthermore, the stacked silicon substrates are applied with pressure at a temperature as high as or higher than the glass transition temperature. In the above-described manner, the stacked silicon substrates can be bonded together.

For the above-described resin material, almost all general resin materials can be used. More specifically, for the resin material, various resins, such as an acrylic resin, a polyimide resin, a silicon resin, a fluorine resin, an epoxy resin, or a polyether amide resin can be used.

If an acrylic resin is used, a polymethyl methacrylate (PMMA) resin may be useful. Furthermore, for the silicon resin, a polydimethylsiloxane (PDMS) resin can be used. If an epoxy resin is used, SU-8 (product name) of Kayaku-MicroChem Co., Ltd. can be used. Furthermore, as a polyether amide resin, HIMAL (product name) of Hitachi Chemical Co., Ltd., benzocyclobutene (BCB), or hydrogens slisesquioxane (HSQ) can be used.

The above-described materials can be bonded at the temperature of about 300 degrees Celsius. Therefore, a transistor or wirings of the energy generation device of the liquid discharge head may not be damaged during bonding of the substrates made of the above-described materials.

For the method for forming the first pattern form, it can be formed by using the lithography method if a photosensitive resin material is used. On the other hand, if a non-photosensitive resin material is used, the first pattern form can be formed by etching. If a resin layer not including silicon is used, the first pattern form can be formed by using plasma etching, which uses gas, such as $O_2$, $O_2/CF_4$, $O_2/Ar$, $N_2$, $H_2$, $N_2/H_2$, or $NH_3$. If a resin layer including silicon is used, the etching can be executed by using mixed gas including a mixture of the above-described gas and fluorocarbon gas, such as $CF_4$ or $CHF_3$.

Alternatively, another bonding method, i.e., "fusion bonding", can be used. In fusion bonding, surfaces of substrates to be bonded together are subjected to a plasma process. Then the substrates are bonded together by using dangling bonds formed thereon. The fusion bonding includes two methods in a large sense.

In a first method for fusion bonding, the surface of the intermediate layer is subjected to plasma activation. Then the plasma-activated surfaces of the intermediate layer is exposed to air to form a hydroxyl group. Then, the surface of the intermediate layer is bonded with the surface of the substrate by hydrogen bonding. The hydroxyl group is formed by reacting on water contents existing in the air. Alternatively, instead of merely utilizing the existing water contents in the air, moisture can be intentionally increased. For the material of the intermediate layer to which the method can be applied, a silicon oxide film, a silicon nitride film, or silicon carbide can be used. In addition, a metallic material, metallic oxides, specific resin materials, on whose surface an oxide film can be easily generated, can be used.

After temporary bonding at the room temperature, anneal processing is executed at the temperature of about 200 to 300 degrees Celsius. By executing the above-described process, $H_2O$ is desorbed by dehydrating reaction among the hydroxyl groups. As a result, a very intense bonding via oxygen atoms can be achieved. In this case, it is necessary to set the surfaces to be bonded as close to each other as intermolecular force can work. Therefore, it is useful to set the surface roughness as low as 1 nanometer or lower.

In a second method for fusion bonding, the dangling bonds are bonded together as they are in a vacuum without utilizing hydrogen bonding. In this method also, it is necessary to set the surface roughness as low as 1 nanometer or lower. However, theoretically, if such low surface roughness can be achieved by polishing, any material can be bonded.

With respect to silicon materials, at least bonding between silicon oxide films, between silicon nitride films, or between a silicon oxide film or a silicon nitride film and silicon has been observed. The patterning can be provided on a silicon oxide film and a silicon nitride film by plasma etching that uses fluorocarbon gas, such as $CF_4$, $CHF_3$, $C_2F_6$, $C_3F_8$, $C_4F_8$, $C_5F_8$, or $C_4F_6$.

The patterning can be provided on a silicon oxide film by wet etching by using fluorinated acid as its base. In addition, the patterning can be provided on a silicon nitride film by wet etching that uses hot phosphoric acid. In addition, if the intermediate layer is made of a metallic material or metallic oxides, the intermediate layer can implement the present invention if the patterning can be provided before bonding.

In addition, as another bonding method, eutectic bonding and diffusion bonding can be used. For the eutectic bonding, bonding between gold materials and bonding of a gold material with a silicon material, a tin material, and a germanium material have been generally observed. In addition, with respect to the eutectic bonding, bonding between a copper material and a tin material and bonding between a palladium material and an indium material have been generally observed. For the diffusion bonding, bonding between gold materials, between copper materials, and aluminum materials has been generally observed.

Now, the relationship among the intermediate layer, the silicon substrate, and dry etching will be described in detail below.

More specifically, as a representative deep reactive ion-etching (RIE) method for dry-etching on silicon, the Bosch process can be used. More specifically, in the Bosch processing, processing for forming a deposited film by using the plasma of C-rich fluorocarbon gas, such as $C_4F_8$, the removal of the deposited film on the surfaces other than the side surfaces, which uses ion components of $SF_6$ plasma, and etching on silicon by utilizing a radical are repeatedly executed.

By executing the Bosch process, an etching rate ratio of silicon to normal resist mask as high as 50 or higher can be easily achieved. If the intermediate layer is made of a resin material, similar results can be obtained for almost all types of resin materials because the composition of the material is very close to that of the resist mask. The thickness of the film to be coated and made of a resin material, which is the material of an intermediate layer, is about several hundreds of nanometers to several tens of micrometers, for example. The above-described film thickness is enough for the thickness of a mask or a stopper used for etching on silicon by the depth of 50 to 800 mlcrometers.

If a silicon oxide film is used, an etching rate ratio of silicon to silicon oxide as high as 100, at the lowest, can be obtained. Furthermore, it is widely known that if a silicon oxide film is generated by using a thermal oxidation method, a silicon oxide film as thick as 25 micrometers or greater can be obtained. However, in order to improve the quality of the resulting film or to execute the process by a method as easy as possible, it is useful if the thickness of the silicon oxide film is 2 micrometers or smaller. Furthermore, if the plasma-enhanced chemical vapor deposition (plasma CVD) method is used in forming a silicon oxide film, a silicon oxide film having a thickness as thick as 50 micrometers or greater can be formed. However, in order to improve the quality of the resulting film or to execute the process by a method as easy as possible, it is useful if the thickness of the silicon oxide film is 10 micrometers or smaller. The above-described film thickness is small enough for the thickness of a mask used for etching on silicon by the depth of 50 to 800 micrometers.

An etching selectivity to silicon higher than the above-described ratio can be obtained if a metal material or metallic oxides other than silicon is used. More specifically, a material having a low index of reaction to an F radical is particularly useful. If a chrome material or an aluminum material is used, an etching selectivity as high as 1,000 can be achieved. The thickness of a film formed by using a metal material or a metallic oxide is about a few micrometers, generally. In order to implement etching by a desired depth, it is useful to appropriately select the thickness of the film to be coated based on the etching rate of the material to silicon.

In the present exemplary embodiment, it is supposed that the Bosch process is executed for dry etching on silicon. However, the present invention is not limited to this. More specifically, another different etching process can implement the present process by appropriately selecting and using the material and the thickness of the intermediate layer.

The present exemplary embodiment has a characteristic effect of planarizing the bottom of the common liquid chamber with an ideally high accuracy and of executing etching at the unified depth within the surface. In other words, because the shape of the bottom of the common liquid chamber is regulated by the intermediate layer, which functions as the stopper, the present exemplary embodiment can process the substrate at the unified depth regardless of the in-plane distribution or aging of the device.

In addition, the present exemplary embodiment can achieve a highly accurate vertical shape of the supply port by effectively preventing a crown-like residue or a bent opening. If etching is executed by using a conventional dual mask process, the etching mask having the very shape of previously etched silicon is used in forming a supply port. On the other hand, the process according to the present invention uses the intermediate layer that functions as a mask. Accordingly, the present exemplary embodiment can easily suppress a phenomenon of eroded opening, such as bent opening.

In addition, by using the Bosch process in the present exemplary embodiment, an endpoint of etching can be easily detected. In etching on silicon, generally, the decrease of the emission intensity of SiF (440 nanometer), which is a reaction product, is monitored. Accordingly, if the etching ends, the end of etching can be detected.

However, in the conventional manufacturing method, it may be difficult to detect the end of etching of a supply port due to the following reasons. That is, if the conventional manufacturing method is used, when etching of a supply port ends, etching of silicon at the bottom surface of the common liquid chamber, whose area is larger than the area of the supply port, is continued at this timing. Therefore, the background signal is too intense to easily detect the end of the etching of the supply port.

On the other hand, in the present exemplary embodiment, etching of the common liquid chamber ends before starting etching of the supply port. Accordingly, the endpoint of etching can be easily detected. Therefore, the reproducibility of the process can be increased.

In addition, according to the present exemplary embodiment, conditions for etching of the common liquid chamber and the supply port can be changed. More specifically, because the aperture ratio and the aspect ratio of a common liquid chamber are different from those of a supply port, optimum conditions may be different between etching of the common liquid chamber and etching of the supply port. In the conventional dual mask process, the etching of the common liquid chamber and the etching of the supply port are executed in parallel to each other. Accordingly, both etching processes cannot be separated from each other.

On the other hand, in the present exemplary embodiment, silicon etching of the common liquid chamber is completed by first dry etching by using the intermediate layer. Because the aperture ratio of the common liquid chamber is higher than that of the supply port, the present exemplary embodiment can easily detect the completion of etching of the common liquid chamber.

In the present exemplary embodiment, it is useful to form the path-forming layer 105 after bonding the first silicon substrate 102 and the second silicon substrate 101 together. An organic resin material is used as a material of the path-forming layer. In addition, the heat resistance of a resin material of an organic resin material is generally low.

As described above, silicon substrates can be bonded together by applying heat (of 200 to 300 degrees Celsius, for example) thereto. If heat is applied to silicon substrates, the organic resin material may not maintain its shape and composition. Accordingly, the present exemplary embodiment forms the path-forming layer 105 after bonding the first silicon substrate 102 and the second silicon substrate 101 together. Therefore, the present exemplary embodiment can effectively prevent the above-described problem of the low heat resistance of an organic resin material.

Figure 2A:
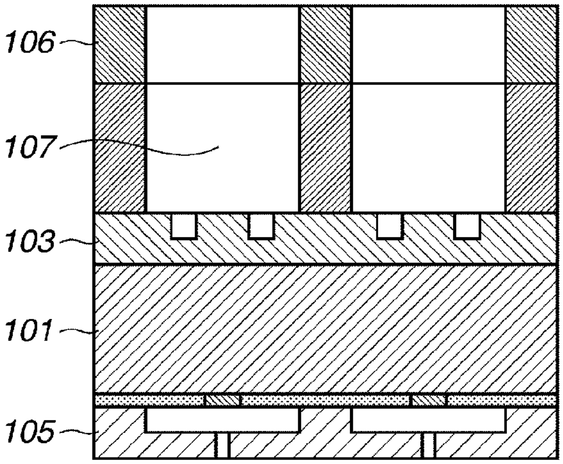
FIG. 2A is a cross section schematically illustrating an example of a method for manufacturing a liquid discharge head according to an exemplary embodiment of the present invention.
Figure 2B:
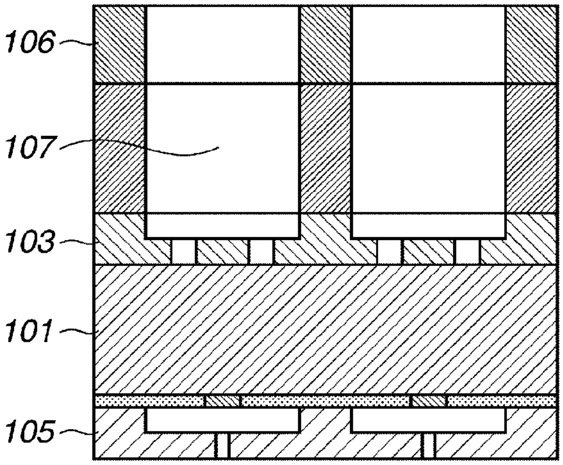
FIG. 2B is a cross section schematically illustrating an example of a method for manufacturing a liquid discharge head according to an exemplary embodiment of the present invention.

In addition, the following configuration is also useful to implement the effect of the present invention. That is, a recessed portion (FIG. 2A) having a recess facing the second silicon substrate 101 is formed first. Then, the bottom of the recessed portion is removed to form the shape illustrated in FIG. 2B.

Now, a second exemplary embodiment of the present invention will be described in detail below. In the present exemplary embodiment, transistors and wirings are formed on a first silicon substrate having a discharge energy generation device through a normal semiconductor manufacturing line. In addition, the silicon substrate conveyed through the normal semiconductor manufacturing line has a thickness of several hundred micrometers. More specifically, a 6-inch substrate is about 625 micrometerthick while an 8-inch substrate has a thickness of 725 micrometers.

If the 6-inch and the 8-inch substrates are merely bonded together, the total substrate thickness may exceed 1 millimeter. A conventional liquid discharge head manufacturing line is designed assuming that a silicon wafer having a normal thickness is conveyed therethrough. Accordingly, if a substrate thicker than 1 millimeter is conveyed through the liquid discharge head manufacturing line, the silicon wafer may not be normally conveyed. In this case, the manufacturing line may need to be redesigned.

For the depth of the common liquid chamber and the supply port, it is not necessary to use the depth deep enough to completely go through the silicon wafer of the normal size. If the common liquid chamber and the supply port has the depth deep enough to go through the normal size silicon wafer, the aspect ratio may adversely become high. In this case, the difficulty of the process may increase.

As described above, it is useful to restrict the thickness of each silicon substrate to a smallest possible thickness having a necessary strength and to restrict the total substrate thickness to the same as the thickness of a normal silicon wafer.

Figure 3A:
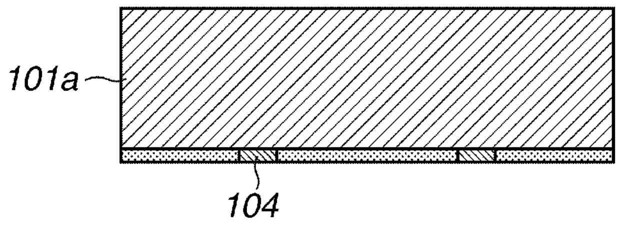
FIG. 3A is a cross section schematically illustrating an example of a method for manufacturing a liquid discharge head according to an exemplary embodiment of the present invention.
Figure 3B:
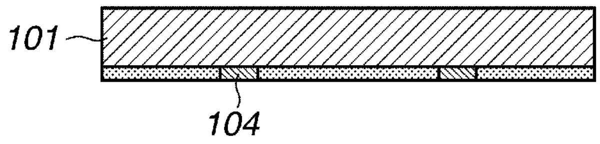
FIG. 3B is a cross section schematically illustrating an example of a method for manufacturing a liquid discharge head according to an exemplary embodiment of the present invention.

Now, an exemplary method for manufacturing a liquid discharge head by the above-described effect of the present invention and by preventing the above-described problem will be described in detail below with reference to FIGS. 3A through 3C. Referring to FIG. 3A, a substrate 101*a*, on which the energy generation device 104 has been formed and which is used for forming a second silicon substrate, is provided. Then, the substrate 101*a* is thinned as illustrated in FIG. 3B to form the second silicon substrate.

The substrate 101*a* can be thinned into the second silicon substrate by mechanical polishing, such as back grinding, chemical-mechanical polishing (CMP), wet etching or dry etching, or a combination of any of above-described methods. The surface of the substrate 101*a* can be mirror-finished by fine mechanical polishing, chemical polishing, or a combination thereof where necessary. The thickness of the second silicon substrate 101 may desirably be 100 to 200 micrometers.

Figure 3C:
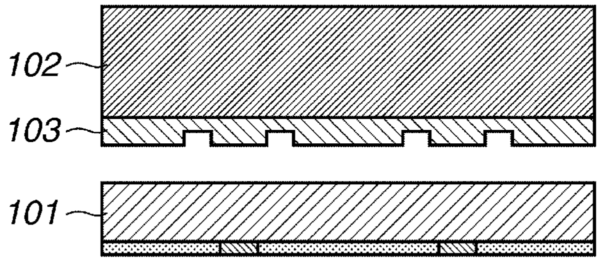
FIG. 3C is a cross section schematically illustrating an example of a method for manufacturing a liquid discharge head according to an exemplary embodiment of the present invention.

Furthermore, the intermediate layer 103 is formed on the first silicon substrate 102 as illustrated in FIG. 3C. In addition, a recessed portion, which is a first pattern form for forming the supply port, is formed on the intermediate layer 103. For the first silicon substrate 102, a thin substrate having the thickness of about 300 to 600 micrometers can be used. The first silicon substrate 102 can be also thinned by the above-described method.

Then, the second silicon substrate 101 and the first silicon substrate 102 are bonded together via the intermediate layer 103.

Thereafter, the silicon substrate can be processed by the same process as described above in the first exemplary embodiment.

By executing the method according to the present exemplary embodiment, the total thickness of the bonded silicon substrate can be appropriately controlled to the thickness as thin as the thickness of the normal silicon wafer. By thinning the silicon substrate as described above, the present exemplary embodiment can effectively restrict the aspect ratio to the lowest possible ratio.

In the present exemplary embodiment, it is useful to form the path-forming layer that constitutes the liquid discharge nozzle after the bonding because of the following reasons. It may be difficult, in terms of the mechanical strength and adaptability of the manufacturing equipment, to form the path-forming layer on a merely thinned silicon substrate and to convey the thin substrate through the manufacturing line. For the material of the path-forming layer, a thick film, such as an organic film, is used. Accordingly, stress is generated by the path-forming layer. Therefore, if a thin wafer is used, the wafer may not tolerate the stress and may finally be warped.

Hereinbelow, working examples of the present invention will be described in detail below.

Working example 1 of the present invention will now be described below. As illustrated in FIG. 3A, at first, the substrate 101*a* for forming a second silicon substrate 101, which has the energy generation device 104 formed on one surface thereof, was generated. Then, the substrate 101*a* was thinned to 200 micrometers by back grounding on the other surface as illustrated in FIG. 3B. After that, the surface of the substrate was polished by CMP to obtain a mirror-finished surface whose surface roughness is as low as 1 nanometer or less.

Furthermore, a first silicon substrate 102, whose thickness is 400 micrometers and on whose surface a silicon oxide film is formed by thermal oxidation, whose thickness is 2.0 micrometers, was prepared. Then, a photosensitive positive type resist (OFPR-PR8-PM (product name) of Tokyo Ohka Kogyo Co., Ltd.) was applied to the bonding surface of the first silicon substrate 102. Furthermore, the first silicon substrate 102 was exposed by using Deep-UV exposure apparatus UX-4023 (product name) of Ushio, Inc. and then was developed. Thus, the applied positive type resist was processed into the recessed first pattern form.

In addition, etching of a silicon oxide film by the depth of 1.5 micrometers, leaving the thickness of 0.5 micrometers unetched was executed by using mixture gas including $CHF_3$, $CF_4$, and Ar. Furthermore, the intermediate layer 103, which includes the silicon oxide film having the first pattern form, was formed on the first silicon substrate 102. The residual positive type resist was removed. The intermediate layer 103 having the first pattern form functions as the first mask used in forming the supply port.

In addition, the bonding surface of the second silicon substrate 101 and the bonding surface of the intermediate layer 103 formed on the first silicon substrate 102 were activated by $N_2$ plasma. Subsequently, the substrates were aligned by using an aligner manufactured by EV Group. Furthermore, as illustrated in FIG. 1B, the first silicon substrate 102 and the second silicon substrate 101 were bonded together via the intermediate layer 103, which includes a silicon oxide film and having the first pattern form, by fusion bonding by using a bonding apparatus of EV Group (product name: EVG 520IS).

Then, a path-forming layer 105, which constitutes the liquid discharge head, was formed on the surface opposite to the bonding surface of the second silicon substrate 101 as illustrated in FIG. 1C.

Furthermore, a photosensitive positive resist (AZP4620 (product name) of Clariant Japan K. K.) was applied to the surface opposite to the bonding surface of the first silicon substrate 102. In addition, the applied positive resist was exposed by using the Deep-UV exposure apparatus (UX-4023 (product name) of Ushio, Inc.) and then was developed. Furthermore, a second mask having the second pattern form for forming the common liquid chamber was formed as illustrated in FIG. 1D.

Then, first dry etching was executed by the Bosch process that alternately uses $SF_6$ and $C_4F_8$ by using the second mask to form the common liquid chamber on the first silicon substrate 102 as illustrated in FIG. 1D.

Then, a part of the intermediate layer 103 was removed to form an opening corresponding to the recessed portion as illustrated in FIG. 1E. Furthermore, second dry etching using the Bosch process, which is the same etching method as that described above by using the intermediate layer 103 as a mask to form a supply port on the second silicon substrate 101 as illustrated in FIG. 1G.

By executing the above-described process, the inventor was able to manufacture the liquid discharge head to which the present working example is applied.

The intermediate layer 103 can also be formed by the following methods.

Figure 4A:
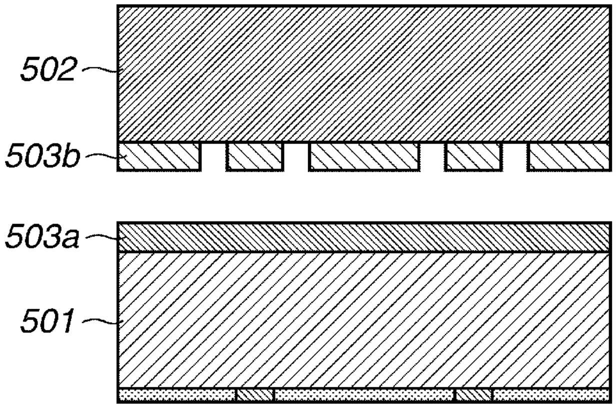
FIG. 4A is a cross section schematically illustrating an example of a method for manufacturing a liquid discharge head according to an exemplary embodiment of the present invention.

More specifically, as illustrated in FIG. 4A, intermediate layers 503*b* is formed on a first silicon substrate 502 and intermediate layers 503*a* is formed on a second silicon substrate 501, which are made of the same material. A recessed form is formed on either one of the substrates (the intermediate layer 503*b* in the example illustrated in FIG. 4A) as the first pattern form.

Figure 4B:
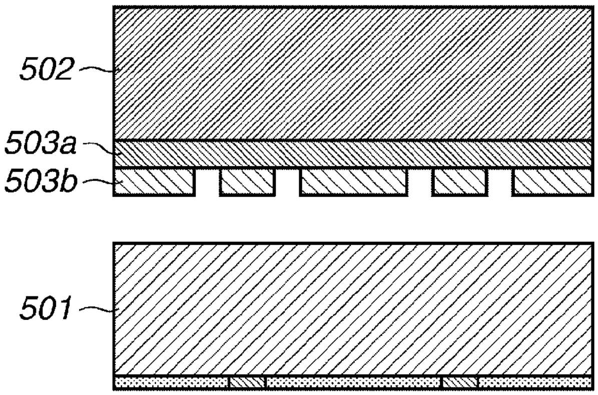
FIG. 4B is a cross section schematically illustrating an example of a method for manufacturing a liquid discharge head according to an exemplary embodiment of the present invention.

Alternatively, as illustrated in FIG. 4B, two intermediate layers 503*a* and 503*b*, which are made of different materials, are formed on either one of the first silicon substrate 502 and the second silicon substrate 501. The first pattern forms are formed on the uppermost intermediate layer 503*b*.

Figure 4C:
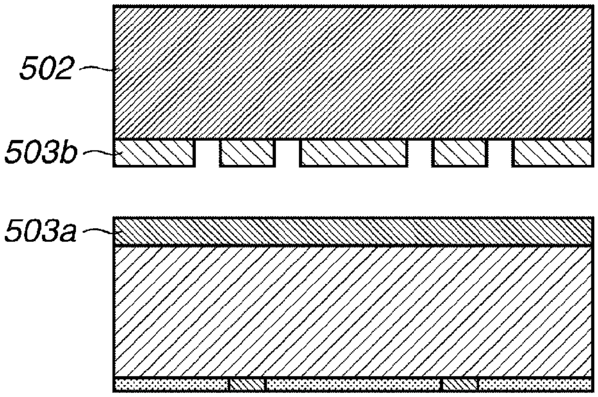
FIG. 4C is a cross section schematically illustrating an example of a method for manufacturing a liquid discharge head according to an exemplary embodiment of the present invention.

Further alternatively, as illustrated in FIG. 4C, intermediate layers made of different materials are formed on each of the first silicon substrate 502 and the second silicon substrate 501, and the first pattern form is formed on either one of the first silicon substrate 502 and the second silicon substrate 501.

The materials of the intermediate layers can be selected from the materials described above.

Now, working example 2 to which the exemplary embodiment of the present invention is applied will be described in detail below.

As illustrated in FIG. 4B, a thermally oxidized film having the thickness of 1.5 mlcrometers is formed on the first silicon substrate 502, and a silicon oxide film formed by plasma CVD method having the thickness of 0.5 micrometers is formed on the first silicon substrate 501. In other words, according to working example 2, the intermediate layer is a pair of bonded silicon oxide films which are formed on each substrate. After completely executing the etching of the common liquid chamber, the exposed thermally oxidized film and the exposed silicon oxide film formed by plasma CVD method were etched by the depth equivalent to 0.5 micrometers by using mixed gas including $C_4F_8$ and $O_2$ to form the first pattern form. After that, second dry etching was executed on the first silicon substrate 502 to form the supply port. The other part of the process is the same as that described above in the working example 1.

Working example 3 will be described in detail below. As illustrated in FIG. 4B, a polyether amide resin (HIMAL (product name) of Hitachi Chemical Co., Ltd.) having the thickness of 2.0 micrometers was formed on the first silicon substrate 502, on which the 0.7 micrometer-thick thermally oxidized film has been formed. In other words, according to working example 3, the intermediate layer includes two layers including the thermally oxidized film and the polyether amide resin layer.

Furthermore, the polyether amide resin was etched by using mixed gas including $O_2$ and $CF_4$ to form the first pattern form. The bonding was executed by thermocompression bonding at the temperature of 280 degrees Celsius by using EVG 520IS. The etching of the common liquid chamber was executed only up to the intermediate layer (the thermally oxidized film). After that, the intermediate layer (the thermally oxidized film) was etched by mixed gas including $C_4F_8$ and $O_2$. Furthermore, the intermediate layer (the polyether amide resin) was exposed, and the supply port was formed by dry etching. The other portion of the process is the same as that described above in working example 1.

Figure 5A:
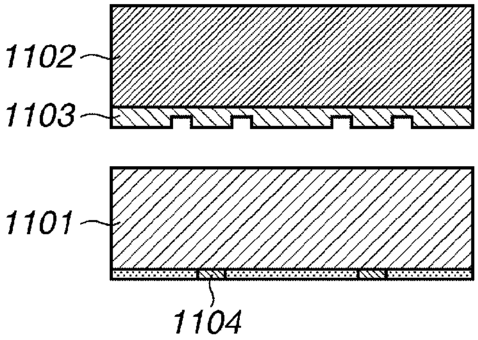
FIG. 5A is a cross section schematically illustrating an example of a method for manufacturing a liquid discharge head according to an exemplary embodiment of the present invention.

Now, working example 4 will be described in detail below. As illustrated in FIG. 5A, an intermediate layer 1103, which has the thickness of 0.7 micrometers and which is made of thermally oxidized silicon, was formed on a first silicon substrate 1102. Furthermore, a photosensitive positive type resist (OFPR-PR8-PM (product name) of Tokyo Ohka Kogyo Co., Ltd.) was applied thereto. In addition, the photosensitive positive type resist was exposed and developed to form the first pattern form to the intermediate layer 1103 for forming the supply port. The photosensitive positive type resist was exposed by using a proximity mask aligner UX-3000SC of Ushio, Inc.

Subsequently, the intermediate layer 1103 was dry-etched by using the pattern formed in the above-described manner to obtain a desired pattern. The intermediate layer 1103 was not provided with openings deep enough for a first silicon substrate 1102 to be exposed and was partially left unetched by an arbitrary thickness. More specifically, a portion of the intermediate layer 1103 was partially left unetched to the depth of about 300 nanometers.

Figure 5B:
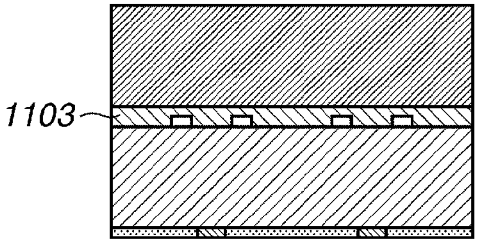
FIG. 5B is a cross section schematically illustrating an example of a method for manufacturing a liquid discharge head according to an exemplary embodiment of the present invention.

In addition, as illustrated in FIG. 5B, the bonding surface of a second silicon substrate 1101 and the bonding surface of the intermediate layer formed on the first silicon substrate 1102 were activated by $N_2$ plasma. Subsequently, the substrates were aligned by using the aligner manufactured by EV Group.

Furthermore, the first silicon substrate 1102 and the second silicon substrate 1101 were bonded together via the intermediate layer 1103, which includes a silicon oxide film and having the first pattern form, by fusion bonding by using the bonding apparatus of EV Group (product name: EVG 520IS). More specifically, the first silicon substrate 1102 and the second silicon substrate 1101 were directly bonded together via the intermediate layer 1103.

Figure 5C:
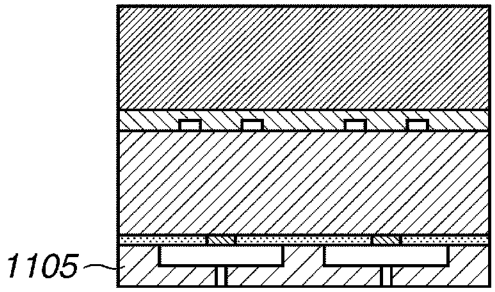
FIG. 5C is a cross section schematically illustrating an example of a method for manufacturing a liquid discharge head according to an exemplary embodiment of the present invention.

Furthermore, as illustrated in FIG. 5C, liquid discharge head nozzles 1105 were formed on the surface of the second silicon substrate 1101 opposite to the bonding surface thereof.

Figure 5D:
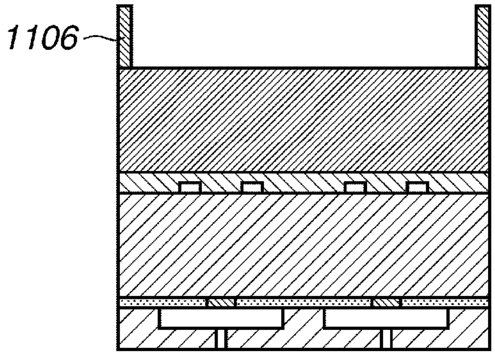
FIG. 5D is a cross section schematically illustrating an example of a method for manufacturing a liquid discharge head according to an exemplary embodiment of the present invention.

In addition, as illustrated in FIG. 5D, a polyether amide resin (HIMAL (product name) of Hitachi Chemical Co., Ltd.) was formed on the first silicon substrate 1102 on the surface opposite to the bonding surface thereof. Furthermore, the photosensitive positive resist (OFPR-PR8-PM (product name) of Tokyo Ohka Kogyo Co., Ltd.) (not illustrated) was applied onto the polyether amide resin. Then, the photosensitive positive resist was exposed by using the proximity exposure apparatus UX-3000 (product name) of Ushio, Inc. and was then developed.

By using the mask pattern formed in the above-described manner from the photosensitive positive resist, a polyether amide resin, which had been previously formed, was etched by dry etching that uses oxygen plasma. In this manner, a second mask 1106 was obtained. Because a polyether amide resin has a high alkali resistance, the polyether amide resin can be used as a material of a mask used in anisotropic silicon etching.

Figure 5E:
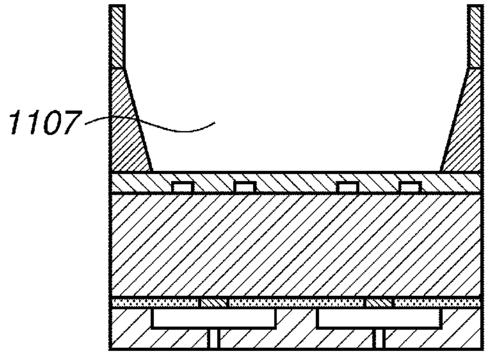
FIG. 5E is a cross section schematically illustrating an example of a method for manufacturing a liquid discharge head according to an exemplary embodiment of the present invention.

Furthermore, as illustrated in FIG. 5E, the second silicon substrate was etched by anisotropic etching by using the second mask 1106 as a mask. As etching liquid, a tetramethyl ammonium hydroxide aqueous solution having the density of 20% was used. The first silicon substrate was etched for twelve hours at the temperature of 80 degrees Celsius. The first silicon substrate was etched down to the intermediate layer 1103 for all patterns on the surface of the wafer. In addition, the intermediate layer 1103 was etched by dry etching down to the depth at which the first pattern form is completely opened.

Figure 5F:
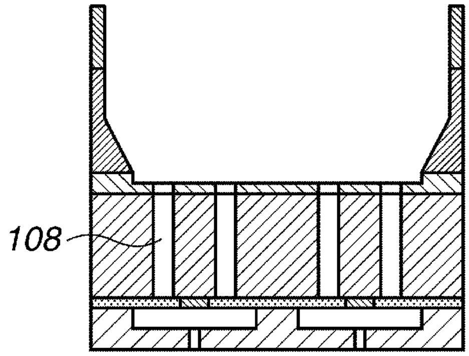
FIG. 5F is a cross section schematically illustrating an example of a method for manufacturing a liquid discharge head according to an exemplary embodiment of the present invention.
Figure 5G:
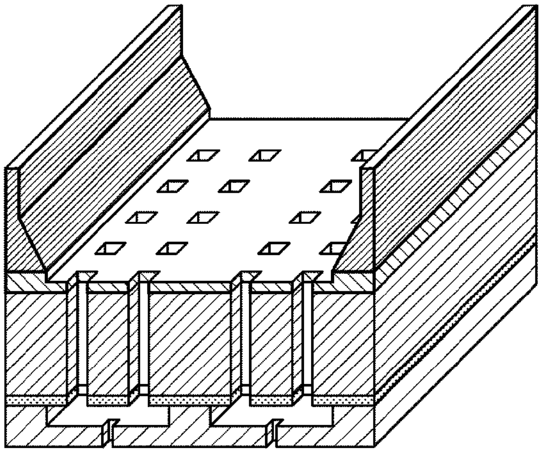
FIG. 5G is a cross section schematically illustrating an example of a method for manufacturing a liquid discharge head according to an exemplary embodiment of the present invention.

Furthermore, as illustrated in FIGS. 5F and 5G, the second silicon substrate 1101 was etched by second dry etching by the same Bosch process as that described above in the first exemplary embodiment by using the intermediate layer 1103 as a mask to form a supply port 1108 thereon.

By executing the above-described process, the inventor was able to manufacture the liquid discharge head to which the present working example is applied.

Figure 6A:
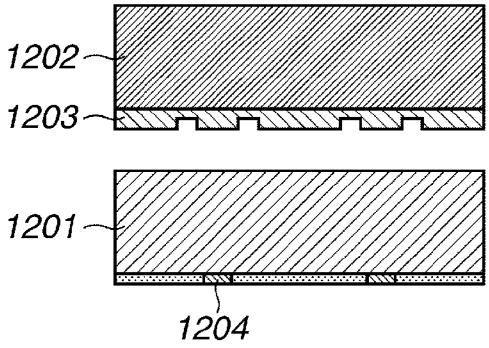
FIG. 6A is a cross section schematically illustrating an example of a method for manufacturing a liquid discharge head according to an exemplary embodiment of the present invention.

Now, working example 5 will be described in detail below. As illustrated in FIG. 6A, an intermediate layer 1203, which has the thickness of 0.7 micrometers and which is made of thermally oxidized silicon, was formed on a first silicon substrate 1202. Furthermore, the photosensitive positive type resist (OFPR-PR8-PM (product name) of Tokyo Ohka Kogyo Co., Ltd.) was applied thereto. In addition, the photosensitive positive type resist was exposed and developed to form the first pattern form to the intermediate layer for forming the supply port. The photosensitive positive type resist was exposed by using a proximity mask aligner UX-3000SC of Ushio, Inc.

Subsequently, the intermediate layer 1203 was dry-etched by using the pattern formed in the above-described manner to obtain a desired pattern. The intermediate layer 1203 was provided with openings not deep enough for the first silicon substrate 1202 to be exposed, and was partially left unetched by an arbitrary thickness. More specifically, a portion of the intermediate layer 1203 was partially left unetched to the depth of about 300 nanometers.

Figure 6B:
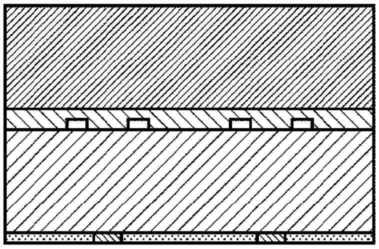
FIG. 6B is a cross section schematically illustrating an example of a method for manufacturing a liquid discharge head according to an exemplary embodiment of the present invention.

In addition, as illustrated in FIG. 6B, the bonding surface of the first silicon substrate 1202 and the bonding surface of the intermediate layer formed on the second silicon substrate 1201 were activated by $N_2$ plasma. Subsequently, the substrates were aligned by using the aligner manufactured by EV Group.

Furthermore, the first silicon substrate 1202 and the second silicon substrate 1201 were bonded together via the intermediate layer 1203, which includes a silicon oxide film and having the first pattern form, by fusion bonding by using the bonding apparatus of EV Group (product name: EVG 520IS). More specifically, the first silicon substrate 1202 and the second silicon substrate 1201 were directly bonded together via the intermediate layer 1203.

Figure 6C:
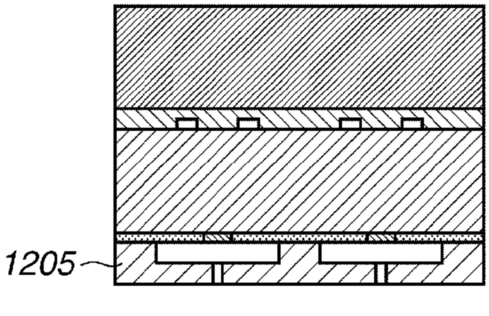
FIG. 6C is a cross section schematically illustrating an example of a method for manufacturing a liquid discharge head according to an exemplary embodiment of the present invention.

Furthermore, as illustrated in FIG. 6C, liquid discharge head nozzles 1205 were formed on the surface of the second silicon substrate 1202 opposite to the bonding surface thereof.

Figure 6D:
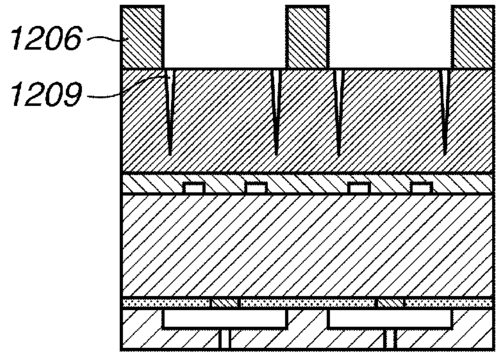
FIG. 6D is a cross section schematically illustrating an example of a method for manufacturing a liquid discharge head according to an exemplary embodiment of the present invention.

In addition, as illustrated in FIG. 6D, a polyether amide resin (HIMAL (product name) of Hitachi Chemical Co., Ltd.) was formed on the first silicon substrate 1202 on the surface opposite to the bonding surface thereof. Furthermore, the photosensitive positive resist (OFPR-PR8-PM (product name) of Tokyo Ohka Kogyo Co., Ltd.) (not illustrated) was applied onto the polyether amide resin. Then, the photosensitive positive resist was exposed by using the proximity exposure apparatus UX-3000 (product name) of Ushio, Inc. and was then developed.

By using the pattern formed in the above-described manner as a mask, a polyether amide resin, which had been previously formed, was etched by chemical dry etching that uses oxygen plasma. In this manner, a second mask 1206 was obtained. Because a polyether amide resin has a high alkali resistance, the polyether amide resin can be used as a material of a mask used in anisotropic silicon etching.

In addition, as illustrated in FIG. 6D, by using yttrium aluminum-garnet (YAG) laser, a lead port process was executed inside the second pattern. More specifically, by using the triple wave of the YAG laser (i.e., third harmonic generation (THG) laser (355 nanometers)), the power and the frequency of the laser were appropriately set. Thus, a lead port having the diameter of about 40 micrometers was formed.

Figure 6E:
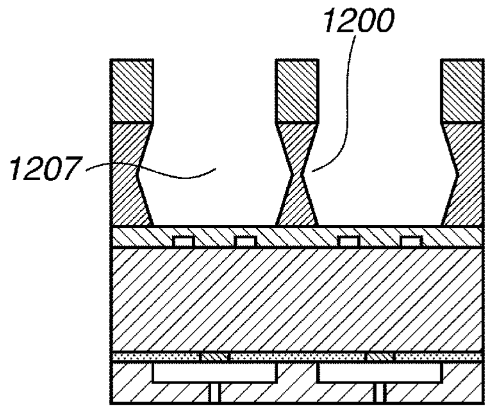
FIG. 6E is a cross section schematically illustrating an example of a method for manufacturing a liquid discharge head according to an exemplary embodiment of the present invention.

Furthermore, as illustrated in FIG. 6E, silicon crystal anisotropic etching was executed to the depth deep enough for the intermediate layer 1203 to be completely exposed by using the second mask 1206. Thus, a common liquid chamber (a first opening) 1207, whose cross section has a shape of a space shaped by angle brackets, was formed. More specifically, because the intermediate layer 1203 neither is completely etched through nor has ny pattern formed thereon, the second silicon substrate 1201 is not exposed at all when viewed from the common liquid chamber 1207 side. Therefore, the etching of the second silicon substrate 1201 will not adversely progress due to the crystal anisotropic etching.

Figure 6F:
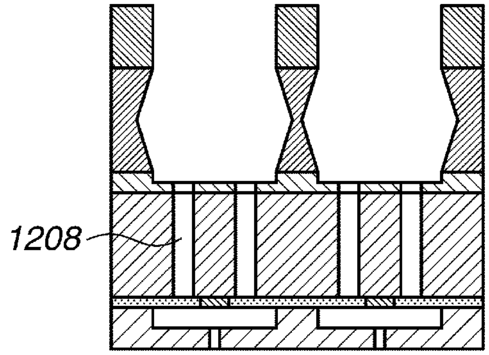
FIG. 6F is a cross section schematically illustrating an example of a method for manufacturing a liquid discharge head according to an exemplary embodiment of the present invention.

In addition, as illustrated in FIG. 6F, the intermediate layer 1203 was etched by dry etching down to the depth at which the first pattern form is completely opened.

Figure 6G:
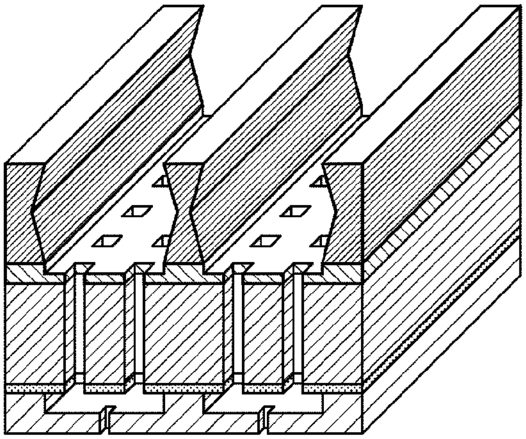
FIG. 6G is a cross section schematically illustrating an example of a method for manufacturing a liquid discharge head according to an exemplary embodiment of the present invention.

Furthermore, as illustrated in FIG. 6G, the intermediate layer 1203 was etched by dry etching down to the depth deep enough for the second silicon substrate 1201 to be exposed to the opening of the first pattern form.

By executing the above-described process, the inventor was able to manufacture the liquid discharge head to which the present working example is applied.

Figure 7A:
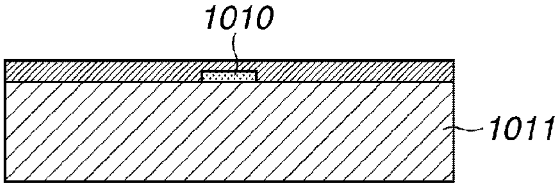
FIG. 7A is a cross section schematically illustrating an example of a method for manufacturing a liquid discharge head according to an exemplary embodiment of the present invention.

Working example 6 will be described in detail below. FIGS. 7A through 711 are cross sections of a liquid discharge head manufactured by the liquid discharge head manufacturing method according to the present exemplary embodiment. Referring to FIG. 7A, a liquid discharge energy generation device 1010 and a semiconductor circuit, which drives the device 1010, are formed on a second silicon substrate 1011 on a (100) plane. Because it is necessary to form a high-quality metal oxide semiconductor (MOS) transistor on the second silicon substrate 1011, a silicon substrate having a (100) plane on its surface is used as the second silicon substrate 1011.

Figure 7B:
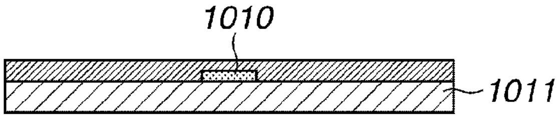
FIG. 7B is a cross section schematically illustrating an example of a method for manufacturing a liquid discharge head according to an exemplary embodiment of the present invention.

The second silicon substrate 1011 is ground and polished on its back surface to be appropriately thinned as illustrated in FIG. 7B. Furthermore, a first silicon substrate 1013 is prepared. For the first silicon substrate 1013, a silicon substrate having a (110) plane on its surface is used. This is because of the following reasons. That is, if a substrate having a (110) plane is etched by silicon anisotropic wet etching by strong alkali, etching in the direction of the surface of the substrate may be restricted because the (111) plane, which has a low etching rate, is vertical to the surface of the substrate. Furthermore, as a result, anisotropic etching for etching the side wall of the common liquid chamber to be substantially vertical, can be executed.

An intermediate layer 1012 having a first pattern is formed on the surface of the first silicon substrate 1013. The first pattern has an opening, but the opening is not deep enough to completely go through the intermediate layer 1012. The intermediate layer 1012 can be formed by executing photolithography and etching to a thermally oxidized film. In this case, the etching is stopped in the middle of the oxidized film.

Figure 7C:
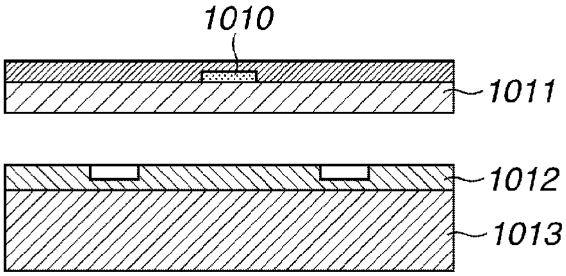
FIG. 7C is a cross section schematically illustrating an example of a method for manufacturing a liquid discharge head according to an exemplary embodiment of the present invention.

The second silicon substrate 1011 and the first silicon substrate 1013 are aligned at appropriate positions as illustrated in FIG. 7C.

Figure 7D:
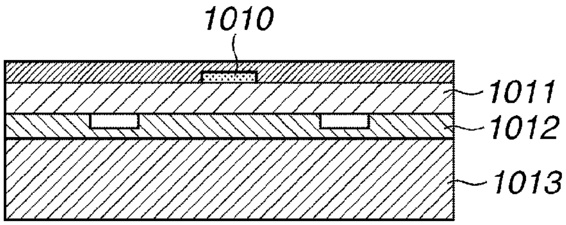
FIG. 7D is a cross section schematically illustrating an example of a method for manufacturing a liquid discharge head according to an exemplary embodiment of the present invention.
Figure 7E:
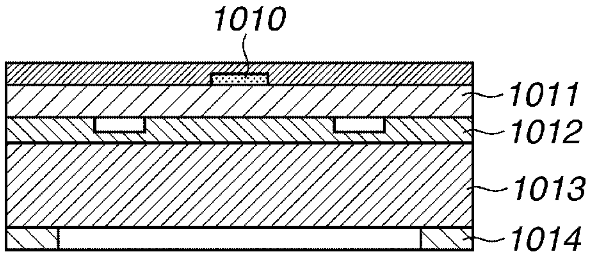
FIG. 7E is a cross section schematically illustrating an example of a method for manufacturing a liquid discharge head according to an exemplary embodiment of the present invention.

Furthermore, as illustrated in FIG. 7D, the second silicon substrate 1011 and the first silicon substrate 1013 are bonded together. After the bonding, as illustrated in FIG. 7E, a second mask layer 1014 having a second pattern is formed on the back surface of the first silicon substrate 1013.

A material having a sufficiently high etching tolerance against anisotropic wet etching and dry etching of the silicon substrate can be used as the material of each of the intermediate layer 1012 and the second mask layer 1014. More specifically, a silicon oxide film, a silicon nitride film, a resin such as an acrylic resin, a polyimide resin, a silicon resin, a fluoro resin, an epoxy resin, or a polyether amide resin can be used.

Figure 7F:
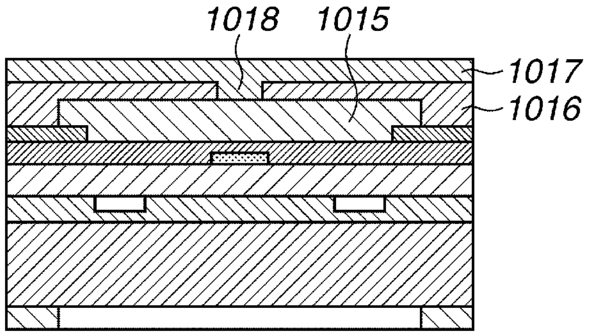
FIG. 7F is a cross section schematically illustrating an example of a method for manufacturing a liquid discharge head according to an exemplary embodiment of the present invention.

As illustrated in FIG. 7F, a path molding material 1015 and a path-forming layer 1016 are formed on the surface of the second silicon substrate 1011. The path-forming layer 1016 covers the path molding material 1015 and has a discharge port on its surface. The path molding material 1015 is removed at a later stage of the process because it is a sacrifice layer.

In addition, in order to prevent damage on the path-forming layer 1016 that may occur due to dry etching or the anisotropic wet etching, the path-forming layer 1016 is covered with a protection film 1017. It is also useful if the protection film 1017 covers the side edges of the substrate as well as its surface.

Figure 7G:
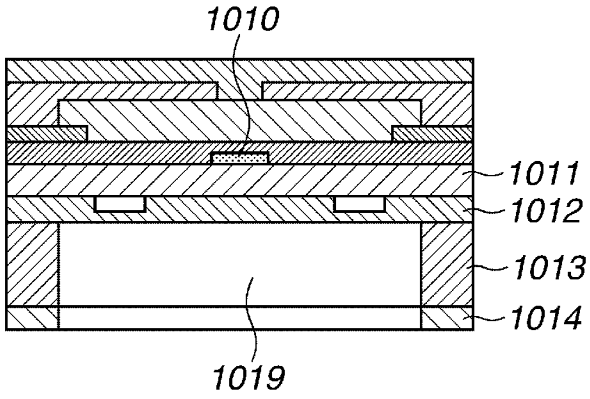
FIG. 7G is a cross section schematically illustrating an example of a method for manufacturing a liquid discharge head according to an exemplary embodiment of the present invention.

After the protection film 1017 is formed, the first silicon substrate 1013 is processed by anisotropic wet etching via the second mask layer 1014 on the back side of the substrate. For the etching liquid, alkaline solutions, such as KOH or tetramethyl ammonium hydroxide (TMAH) can be used. On the first silicon substrate 1013, the anisotropic etching progresses in the direction vertical to the surface of the substrate and the intermediate layer 1012 is then exposed as illustrated in FIG. 7G.

As illustrated in the drawing, the anisotropic wet etching stops on the intermediate layer 1012. Therefore, it is enabled to process the etching of a common liquid chamber 1019 by the uniform depth within the substrate. In addition, the depth of the etching can be effectively controlled.

Subsequently, the intermediate layer 1012 was etched by dry etching down to the depth at which the first pattern form is completely opened. The intermediate layer 1012 can be etched by either wet etching or dry etching. However, dry etching may be more useful because the anisotropic etching in the direction of the depth can be easily executed by dry etching.

Figure 7H:
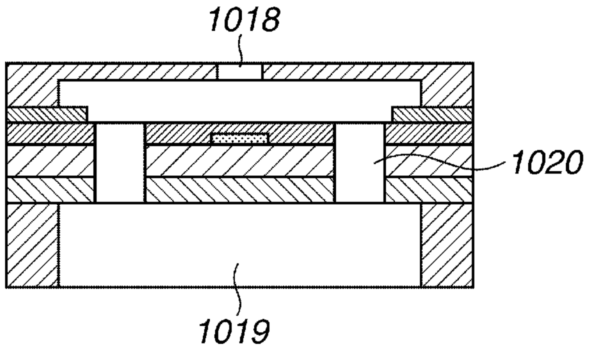
FIG. 7H is a cross section schematically illustrating an example of a method for manufacturing a liquid discharge head according to an exemplary embodiment of the present invention.

If the opening of the intermediate layer 1012 is exposed, a supply port 1020 is processed by dry etching via the opening. Subsequently, the path molding material 1015 and the protection film 1017 are removed. In the above-described manner, an ink supply path through the substrate is completely formed as illustrated in FIG. 7H.

According to this working example having the above-described configuration, the common liquid chamber can be processed in the vertical direction of the substrate by the anisotropic wet etching. Accordingly, the present exemplary embodiment can increase the reproducibility of the process. In addition, the wet etching apparatus used in the present exemplary embodiment is generally inexpensive. In addition, because the (111) plane is exposed on the side wall of the common liquid chamber by processing by the anisotropic wet etching, it becomes easy to prevent otherwise possible erosion of the common liquid chamber side wall by alkaline solutions, such as an ink.

Figure 8A:
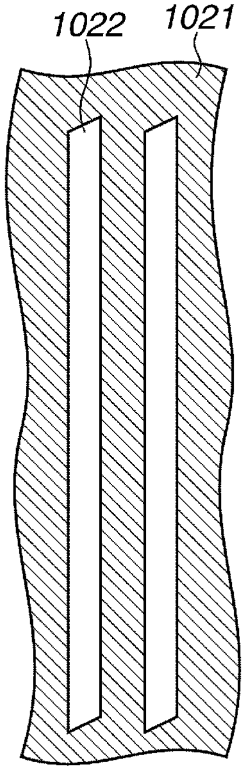
FIG. 8A is a diagram schematically illustrating a liquid discharge head manufacturing method according to an exemplary embodiment of the present invention.
Figure 8B:
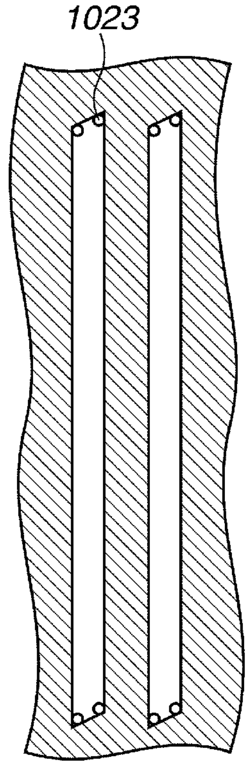
FIG. 8B is a diagram schematically illustrating a liquid discharge head manufacturing method according to an exemplary embodiment of the present invention.
Figure 8C:
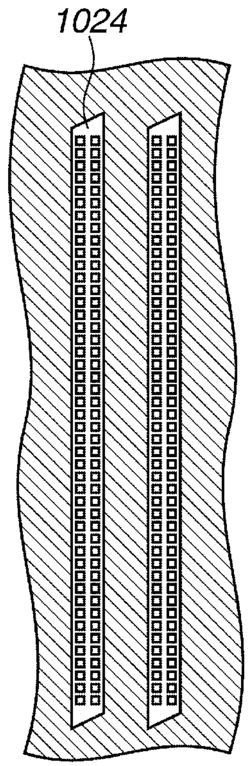
FIG. 8C is a diagram schematically illustrating a liquid discharge head manufacturing method according to an exemplary embodiment of the present invention.

Now, working example 7 will be described in detail below. FIGS. 8A through 8C are plan views of the substrate viewed from the back side thereof. At first, by executing the process similar to that in the working example 6, the first silicon substrate and the second silicon substrate are bonded together.

After that, as illustrated in FIG. 8A, a second mask layer 1021 is formed on the back side of the second silicon substrate. The second mask layer 1021 includes a parallelogram-shaped opening 1022. In addition, the (111) plane of the first silicon substrate is corresponded with the long-edge direction of the parallelogram-shaped opening 1022.

As illustrated in FIG. 8B, before processing the first silicon substrate on its back surface by anisotropic wet etching, the opening 1022 is etched at its four corners. In the present exemplary embodiment, the etching is executed by the laser process. For the depth of process for forming a laser-processed hole 1023 illustrated in FIG. 8B, it is useful to form the hole down to the depth equivalent to the thickness of the first silicon substrate.

By executing the anisotropic wet etching as illustrated in FIG. 8C, the anisotropic wet etching progresses from the laser-processed hole 1023. Accordingly, no skewed (111) plane may occur at the bottom of the common liquid chamber due to the etching. Therefore, the entire intermediate layer 1024 existing at the bottom of the common liquid chamber can be completely exposed. After that, by executing the process similar to that in the working example 6, the supply port is etched by dry etching via the opening of the intermediate layer 1024. In the above-described manner, an ink supply path can be completely formed.

The process by etching executed before the anisotropic wet etching is not limited to the laser process. Alternatively, a third etching mask layer can be formed on the second mask layer 1021 and processed by dry etching, such as the Bosch process. Further alternatively, sandblasting can be used instead. For the etching executed before the anisotropic wet etching, it is not necessary to achieve a very high form-generation process accuracy. Accordingly, an etching method and etching conditions, by which the process speed can be increased, can be used.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims the benefit of Japanese Patent Application No. 2010-005824 filed Jan. 14, 2010 and Japanese Patent Application No. 2011-002039 filed Jan. 7, 2011 which are hereby incorporated by reference herein in their entirety.

The invention claimed is:

1. A method for processing a silicon substrate comprising:

providing a combination of a first silicon substrate, a second silicon substrate, and an intermediate layer including a plurality of recessed portions, which is provided between the first silicon substrate and the second silicon substrate;

forming a first through hole that goes through the first silicon substrate by executing a first etching of the first silicon substrate on a surface of the first silicon substrate opposite to a bonding surface with the intermediate layer by using a first mask, and exposing a portion of the intermediate layer corresponding to the plurality of recessed portions of the intermediate layer;

forming a plurality of openings on the intermediate layer by removing a portion constituting a bottom of the plurality of recessed portions; and forming a second through hole that goes through the second silicon substrate by executing second etching of the second silicon substrate by using the intermediate layer on which the plurality of openings are formed as a mask.

2. The method according to claim 1, wherein in the providing, the first silicon substrate and the second silicon substrate are bonded together via the intermediate layer.

3. The method according to claim 1, wherein the intermediate layer is a resin layer, a silicon oxide film, a silicon nitride film, a silicon carbide film, a metallic film different from silicon, or an oxide film or a nitride film thereof.

4. The method according to claim 1, wherein the first etching is dry etching.

5. The method according to claim 1, wherein the first etching is crystal anisotropic etching.

6. The method according to claim 1, wherein the second etching is dry etching.

7. The method according to claim 5, wherein a plane direction of the first silicon substrate is [110] and a plane direction of the second silicon substrate is [100].

* * * * *